United States Patent
Suen et al.

(10) Patent No.: US 10,755,934 B2
(45) Date of Patent: Aug. 25, 2020

(54) SYSTEMS AND METHODS FOR CHEMICAL MECHANICAL POLISH AND CLEAN

(71) Applicant: Taiwan Semiconductor Manufacturing Company, Ltd., Hsin-Chu (TW)

(72) Inventors: Shich-Chang Suen, Hsinchu (TW); Chi-Jen Liu, Taipei (TW); Ying-Liang Chuang, Hsinchu County (TW); Li-Chieh Wu, Hsinchu (TW); Liang-Guang Chen, Hsinchu (TW); Ming-Liang Yen, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/711,349

(22) Filed: Dec. 11, 2019

(65) Prior Publication Data

US 2020/0118823 A1    Apr. 16, 2020

Related U.S. Application Data

(62) Division of application No. 15/267,670, filed on Sep. 16, 2016, now Pat. No. 10,515,808, which is a
(Continued)

(51) Int. Cl.
*H01L 21/28* (2006.01)
*H01L 21/02* (2006.01)
(Continued)

(52) U.S. Cl.
CPC ...... *H01L 21/28123* (2013.01); *B24B 37/20* (2013.01); *H01L 21/02074* (2013.01);
(Continued)

(58) Field of Classification Search
None
See application file for complete search history.

(56) References Cited

U.S. PATENT DOCUMENTS

| 5,643,406 A | 7/1997 | Shimomura et al. |
| 6,082,373 A | 7/2000 | Sakurai et al. |

(Continued)

FOREIGN PATENT DOCUMENTS

| CN | 1494735 | 5/2004 |
| CN | 102615555 | 8/2012 |

(Continued)

OTHER PUBLICATIONS

Xia, Annie, "Production of High Purity Functional Water at Point-of-Use for Advanced Mask Cleaning Processes," Proceedings of the 2010 International Workshop on EUV Lithography, Jun. 22-24, 2010, pp. 1-13.
(Continued)

*Primary Examiner* — Roberts P Culbert
(74) *Attorney, Agent, or Firm* — Haynes and Boone, LLP

(57) ABSTRACT

A chemical mechanical polishing (CMP) system and associated semiconductor fabrication methods are disclosed herein. An exemplary method includes performing a planarization process in a polishing unit of a CMP system to planarize a surface of a material layer using a CMP slurry. The method further includes, after performing the planarization process, performing a buffing process in the polishing unit of the CMP system to buff the surface of the material layer using an ozone gas dissolved in deionized water ($O_3$/DIW) solution. The method further includes controlling the performing of the planarization process and the performing of the buffing process, such that the CMP slurry is received by the polishing unit from a first pipeline during the planarization process and the $O_3$/DIW solution is received
(Continued)

by the polishing unit from a second pipeline during the buffing process.

20 Claims, 12 Drawing Sheets

Related U.S. Application Data division of application No. 14/134,914, filed on Dec. 19, 2013, now Pat. No. 9,449,841.

(51) Int. Cl.
*H01L 29/66* (2006.01)
*B24B 37/20* (2012.01)
*H01L 21/321* (2006.01)
*H01L 21/67* (2006.01)

(52) U.S. Cl.
CPC .... *H01L 21/3212* (2013.01); *H01L 29/66545* (2013.01); *H01L 21/67051* (2013.01)

(56) References Cited

U.S. PATENT DOCUMENTS

| | | | |
|---|---|---|---|
| 6,265,781 B1 | 7/2001 | Andreas | |
| 6,526,995 B1 | 3/2003 | Hackenberg | |
| 6,635,562 B2 | 10/2003 | Andreas | |
| 6,756,308 B2 | 6/2004 | Small | |
| 6,776,691 B2 | 8/2004 | Nishimura et al. | |
| 6,805,701 B1 | 10/2004 | Fittkau | |
| 7,318,870 B2 | 1/2008 | Han et al. | |
| 8,183,139 B2 | 5/2012 | Marxsen et al. | |
| 8,815,728 B2 | 8/2014 | Jiang et al. | |
| 8,920,567 B2 | 12/2014 | Devarapalli et al. | |
| 2002/0155681 A1 | 10/2002 | Hu et al. | |
| 2004/0033696 A1 | 2/2004 | Hu et al. | |
| 2007/0152252 A1 | 7/2007 | Buehler et al. | |
| 2007/0181153 A1 | 8/2007 | Kobayashi | |
| 2008/0171440 A1 | 7/2008 | Kodera | |
| 2017/0004972 A1 | 1/2017 | Suen et al. | |

FOREIGN PATENT DOCUMENTS

| | | |
|---|---|---|
| KR | 2004-0051698 | 6/2004 |
| KR | 100821830 | 4/2008 |

OTHER PUBLICATIONS

Office Action dated Oct. 30, 2016, issued by the Korean Patent Office in Korean Patent Application No. 10-2014-0184689, 15 pages.

SYSTEMS AND METHODS FOR CHEMICAL MECHANICAL POLISH AND CLEAN

PRIORITY

This is a divisional application of U.S. patent application Ser. No. 15/267,670, filed Sep. 16, 2016, which is a divisional application of U.S. patent application Ser. No. 14/134,914, filed Dec. 19, 2013, now U.S. Pat. No. 9,449,841, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. In other schemes of metal integration, some form of damascene processing may be involved in which patterns are etched into a dielectric and then the patterns are filled with metal layers by blanket deposition onto the wafer surface, for example by chemical vapor deposition (CVD).

Chemical mechanical polishing (CMP) has become a key technology driver to achieve local or global wafer planarization for submicron advanced semiconductor ICs. The CMP process is used to planarize and remove excess metal over the dielectric and to produce a planar semiconductor structure wherein the metal lines or plugs, barrier metal, and exposed dielectric surfaces are coplanar. An improved method and system for CMP and post cleaning are highly desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, although the present disclosure provides examples may be used in a "gate last" metal gate process, one skilled in the art may recognize applicability of the present invention to other processes of fabricating the gate structure, and/or use of other materials in the gate structure.

Figure 1:
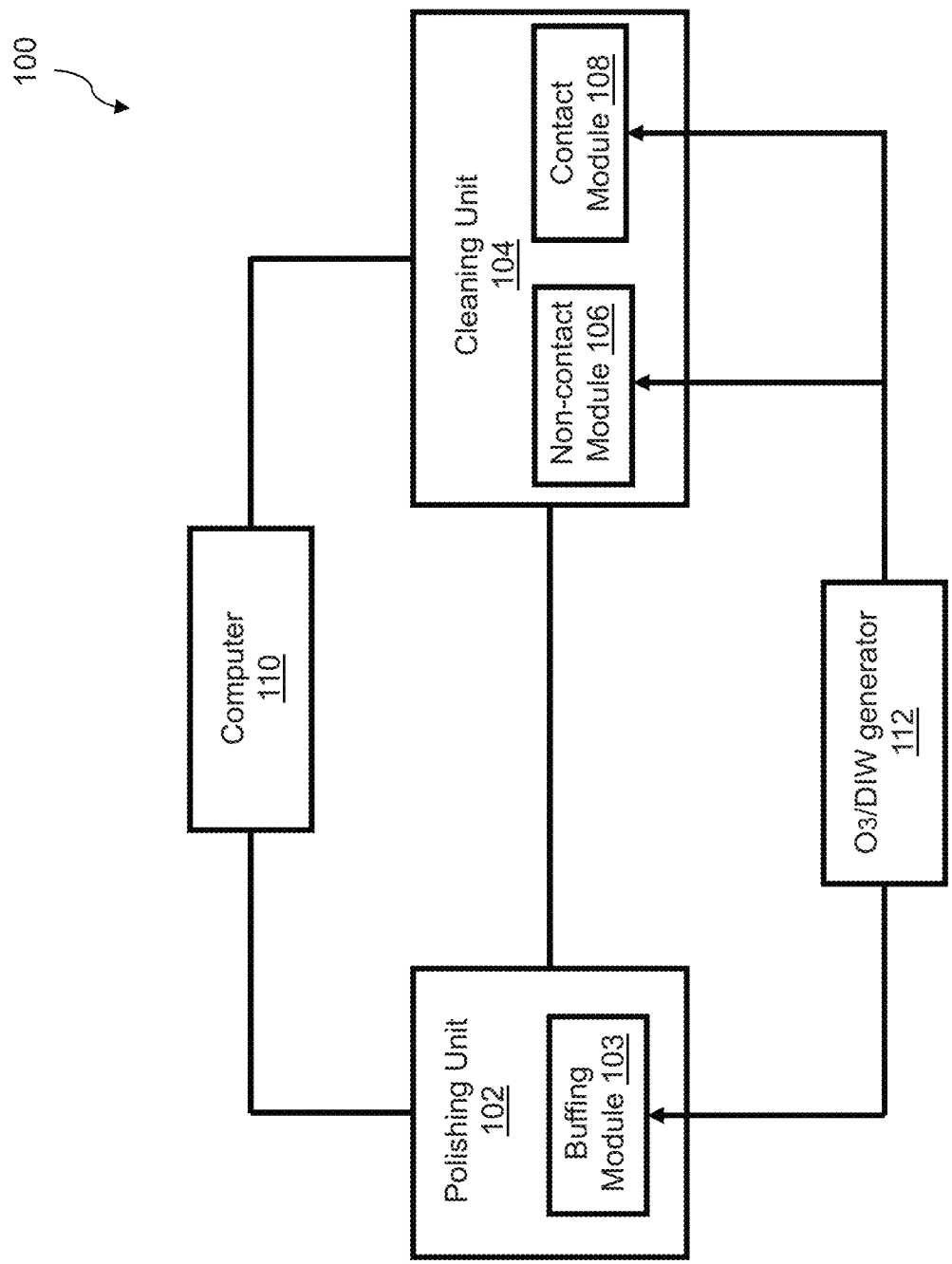
FIG. 1 is a block diagram of chemical mechanical polish (CMP) system for implementing one or more embodiments of the present invention.

FIG. 1 is a block diagram of a chemical mechanical polish (CMP) system 100 for implementing one or more embodiments of the present invention. As shown in FIG. 1, the CMP system 100 includes a polishing unit 102 and a cleaning unit 104. The polishing unit 102 and the cleaning unit 104 may be coupled to a computer 110 for controlling the polishing unit 102 and/or cleaning unit 104 to perform programmable processes. The polishing unit 102 and the cleaning unit 104 may also be coupled to ozone ($O_3$)/deionized water (DIW) generator 112 which is configured to generate and provide $O_3$/DIW to the polishing unit 102 and the cleaning unit 104. Although not shown, in some embodiments, the CMP system 100 may further include a drying unit configured to dry a cleaned wafer including a semiconductor structure, and one or more robot arms configured to transfer and handle one or more wafers simultaneously or individually into and out of the CMP system, and among the different units of the CMP system.

The polishing unit 102 may include components for planarizing a metal layer and/or a dielectric layer in a wafer, such as one or more polishing pads configured to polish and buff the surface of the wafer. The polishing unit 102 may also include one or more polishing heads, a polishing slurry supply, a water supply, a wafer loading mechanism, and other necessary components. In some embodiments, the CMP slurry may be suspended in a mild etchant, such as potassium or ammonium hydroxide. The CMP slurry may include ferric nitrate, peroxide, potassium iodate, ammonia, silica, alumina, and/or other slurry materials are applicable. In some embodiments, the CMP slurry also includes organic additives configured to provide a better topography after the CMP process. The organic additives in the CMP slurry may also improve the anti-corrosion performance in the polished the surface of the wafer. In some embodiments, the polishing unit 102 may also include components for buffing the surface of the wafer after the planarization using CMP slurry.

The cleaning unit 104 may include one or more modules, such as a non-contact module 106 and a contact module 108. In some embodiments, the non-contact module 106 may include a megasonic cleaner that can clean the surface of the wafer in a water tank using megasonic energy. The non-contact module 106 may also include a spray nozzle that has a megasonic generator coupled to the spray nozzle. In some embodiments, the contact module 108 may include polyvinyl alcohol (PVA) brush scrubbers configured to contact the surface of the wafer and clean the slurry residue on the surface of the wafer. The non-contact module 106 and the contact module 108 will be discussed in detail later in the present disclosure.

The computer 110 includes a processor, memory, and input/output with which to perform the steps and operations discussed later in the present disclosure. The computer 110 can be distributed in various locations, and can physically be included in whole or in part with the CMP system 100 or a different facility. The computer file may include CMP data, such as such as CMP system history data, cleaning history data, metrology tool data, and statistical process control (SPC) data. The CMP data may be stored in a computer readable media on the computer 110. Some common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read. The computer 110 may control the polishing unit 102 and the cleaning unit 104 to perform one or more programmable operations during the CMP process.

The $O_3$/DIW generator 112 may generate $O_3$ and dissolve the generated $O_3$ into the DIW using any suitable technology to form an $O_3$/DIW solution. In some embodiments, the concentration of $O_3$ dissolved in the $O_3$/DIW solution may be in a range from about 5 ppm to about 70 ppm. The $O_3$/DIW solution may be provided to a buffing module 103 included in the polishing unit 102, such as one or more pipelines coupled to the buffing pad(s). The $O_3$/DIW may also be provided to the non-contact module 106 of the cleaning unit 104 and/or the contact module 108 of the cleaning unit 104. In some embodiments, the $O_3$/DIW generator 112 may include an $O_3$ gas) generator providing $O_3$ gas) to be dissolved into the DIW. The dissolving process may include flowing the $O_3$ gas) within one or more fiber membranes, and immersing the one or more fiber membranes in the DIW so that the $O_3$ gas) may diffuse from inside the fiber membranes to the outside to be dissolved into the DIW.

Figure 2:
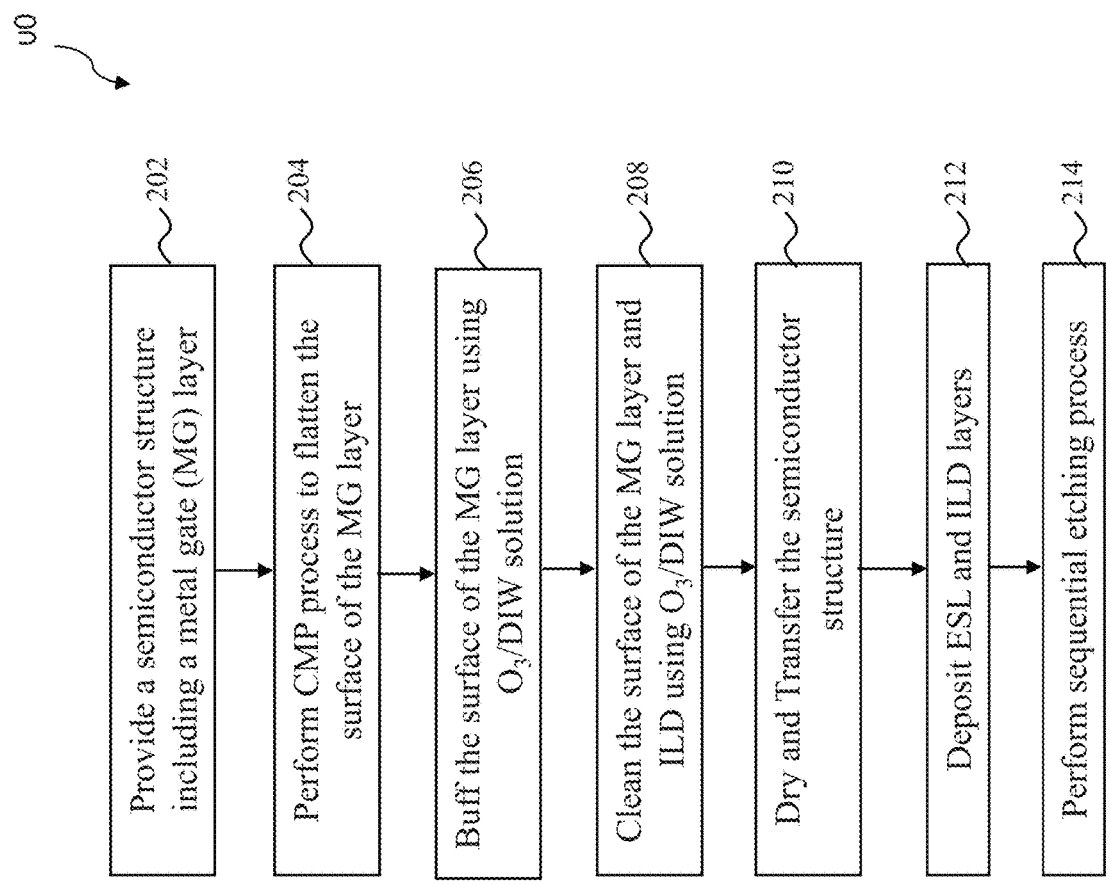
FIG. 2 is a flowchart illustrating a method of fabricating a semiconductor device using CMP system of FIG. 1 according to various aspects of the present disclosure.

FIG. 2 is a flowchart illustrating a method 200 of fabricating a semiconductor device using CMP system 100 according to various aspects of the present disclosure. It should be understood that additional processes may be provided before, during, and after the method 200 of FIG. 2, and that some other processes may be briefly described herein. FIGS. 3, 4A-4B, 5, 6A-6B, 7, 8A-8B, 9A-9B, 10A-10B are cross-sectional views of various embodiments of a semiconductor structure 300 at various stages of fabrication according to the method 200 of FIG. 2. It should be noted that the semiconductor structure 300 may be formed as part of a semiconductor device and may be fabricated with a CMOS process flow. In some embodiments, the semiconductor structure 300 is formed in an upper portion of a substrate. In some embodiments, the semiconductor structure 300 is included in a layer that is formed over a substrate. For example, the semiconductor structure 300 may be formed in a layer of a semiconductor device including a multi-layer interconnect (MLI) structure and an interlayer dielectric (ILD) integrated with the MLI structure.

Figure 3:
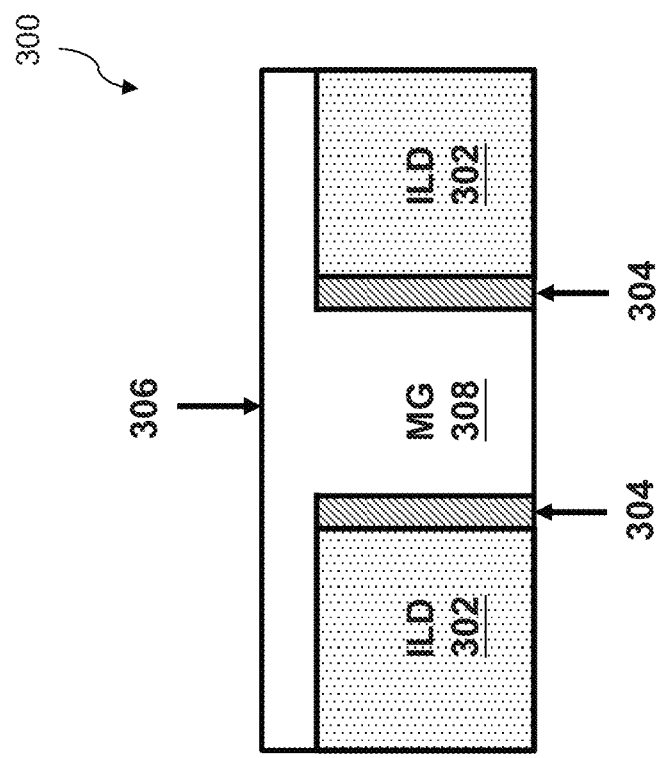
FIGS. 3, 4A, 4B, 5, 6A, 6B, 7, 8A, 8B, 9A, 9B, 10A, and 10B are cross-sectional views of various embodiments of a semiconductor device at various stages of fabrication according to the method of FIG. 1.

Referring to FIGS. 2 and 3, the method 200 begins with step 202 by providing the semiconductor structure 300 including a metal gate (MG) layer 308. As shown in FIG. 3, semiconductor structure 300 includes interlayer dielectric (ILD) 302 disposed over a substrate (not shown). In some embodiments, the ILD 302 is included in a substrate (not shown) of a semiconductor device. In some embodiments, the substrate may be a silicon wafer. The substrate may also include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In some alternative embodiments, the substrate includes a semiconductor on insulator (SOI). In some embodiments, the semiconductor structure 300 may also include a dielectric layer formed over the substrate. The dielectric layer may include silicon oxide. In some examples, the dielectric layer may additionally or alternatively include silicon nitride, silicon oxynitride, or other suitable dielectric material. In some embodiments, ILD 302 may include silicon oxide, oxynitride or other suitable materials. ILD 302 may include a single layer or multiple layers. An ILD layer may be formed by a suitable technique, such as CVD, ALD and spin-on technique.

A trench 306 may be formed between two adjacent ILD 302, and spacers 304 may be formed on the walls of the trench 306 as shown in FIG. 3. The metal gate (MG) layer 308 may then be deposited on the substrate to fill the trench 306. In some embodiments, excessive MG layer may be deposited on the ILD 302. The MG layer 308 may include aluminum (Al), tungsten (W), copper (Cu), or other suitable metal material deposited by CVD, physical vapor deposition (PVD), electrochemical plating (ECP), or other suitable process. Excess metal may then be removed by a CMP process to produce a planar surface of the semiconductor structure as discussed later in the present disclosure.

In some embodiments, the semiconductor structure 300 may be fabricated in a gate last process (also referred to as a replacement poly gate (RPG) process). In a gate last process, a dummy dielectric and dummy poly gate structure may be initially formed and may be followed by a normal CMOS process flow until deposition of an interlayer dielectric (ILD). The dummy dielectric and dummy poly gate structure may then be removed and replaced with a high-k gate dielectric/metal gate structure.

Figure 4B:
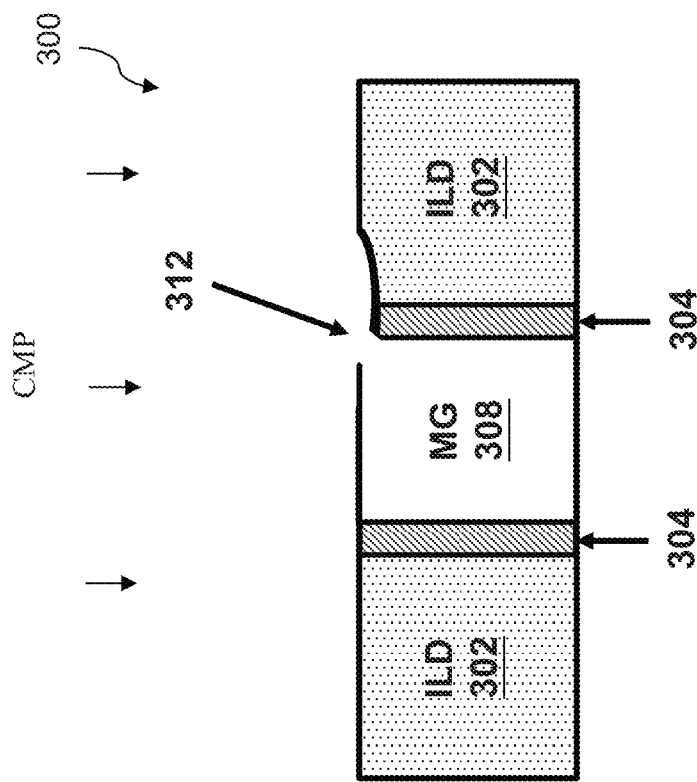
Figure 4A:
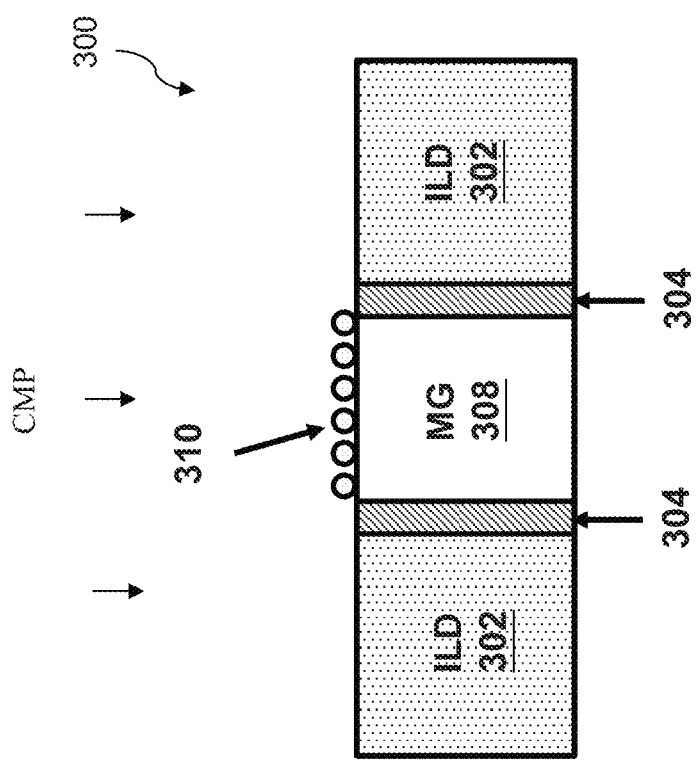

Referring to FIGS. 2 and 4A-4B, method 200 proceeds to step 204 by performing a chemical mechanical polish (CMP) process to flatten the surface of the MG layer 308 using a polishing unit 102. In some embodiments, the CMP process is performed on the metal layer 308, the ILD 302, and the spacers 304, to remove excess metal (e.g., metal outside of the trenches 306), thereby exposing and making substantially coplanar a top surface of the metal layer 308, the spacers 304, and the ILD 302, as shown in FIG. 4A. Typical CMP processing may include mounting the wafer including the semiconductor structure on rotating holders and lowering the wafer onto a pad or table head surface rotating in the opposite direction. CMP slurry suspended in a mild etchant, such as potassium or ammonium hydroxide, may then be applied to the polishing pad. Typical CMP slurries may be used for the CMP process, such as slurries including ferric nitrate, peroxide, potassium iodate, ammonia, silica, and/or alumina, but other slurry materials are applicable. The rotating wafer is pressed face-down against the rotating polishing pad and the slurry is pressed against the face of the wafer by the pad. A combination of chemical and physical effects removes features from the wafer surface. Typical CMP processing includes: (1) chemical action involving hydroxyl ions attacking silicon oxide, causing surface softening and chemical dissolution, and oxidants enhancing metal dissolution; and (2) mechanical action involving polishing rotation and pressure.

Referring to FIG. 4A, in some embodiments, because the CMP slurry may include organic additives to improve the anti-corrosion performance, after the CMP process, the corrosion inhibitor 310 from the CMP slurry may remain on the polished surface either in a mono-layer form, or in an aggregate form. In some embodiments, the residue corrosion inhibitor 310 on the surface of the MG layer 308 may degrade the interfacial adhesion between the polished MG layer and the subsequent deposit film, such as the etch stop layer (ESL) to be deposited over the MG layer 308. For example, during the following film deposition process at a high temperature, the residue corrosion inhibitor 310 may be vaporized, which may result in a film peeling problem. The residue corrosion inhibitor 310 may also cause unexpected metal corrosion by the following chemical process, such as selective ditching for silicide process.

Referring to FIG. 4B, in some embodiments after the CMP process, the metal residue 312 on ILD 302 may provide a chemical attack path in the following processes. For example, after etching to form the contact/via holes, a nickel (Ni) seed layer may be deposited, and a silicide process may be performed to form a nickel silicide (NiSi$_2$) layer as a sealing layer. A selective etching solution, such as H$_2$SO$_4$, may then be used to clean the excessive nickel (Ni). With metal residue 312 left on ILD 302, the acid solution may damage the MG layer 308 through the chemical attack path by reacting with the metal residue 312.

Figure 5:
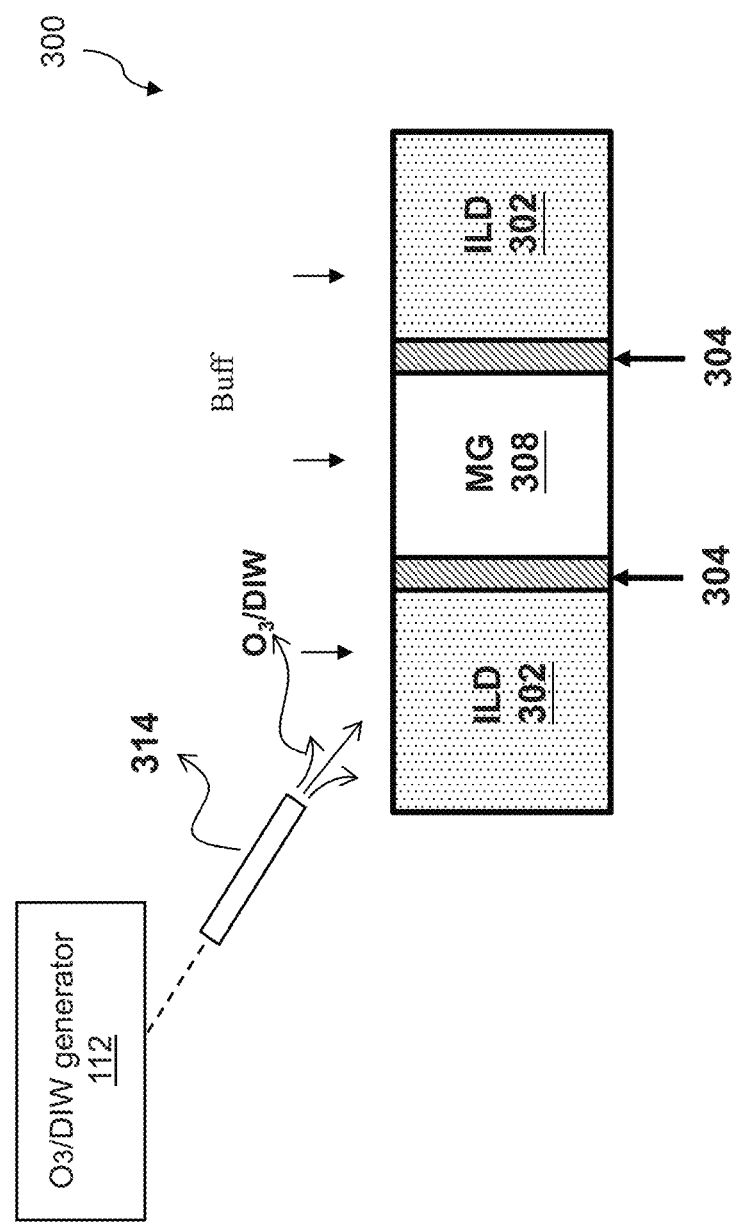

Referring to FIGS. 2 and 5, method 200 proceeds to step 206 by buffing the surface of the semiconductor structure 300 using the polishing unit 102. In some embodiments, in order to remove the residue corrosion inhibitor 310 and the metal residue 312, the O$_3$/DIW generator 112 may be coupled to the polishing unit 102. In some embodiments, the polishing unit 102 may include one or more pipelines configured to supply CMP slurries to the polishing pads to perform the polishing process at step 204. In some embodiments, the one or more pipelines in the polishing unit 102 may be coupled to the O$_3$/DIW generator 112 and configured to supply the buffing solutions including the O$_3$/DIW solution to the buffing pads to buff the surface of the semiconductor structure 300. For example, one pipeline 314 of the buffing module 103 may be coupled to the O$_3$/DIW generator 112 as shown in FIG. 5 to provide the O$_3$/DIW solution to the corresponding buffing pad during the buffing process.

Referring to FIGS. 2, 6A-6B, and 7, method 200 proceeds to step 206 by cleaning the surface of the MG layer 308 and ILD 302 using O$_3$/DIW solution after the buffing process at step 206. In some embodiments, the cleaning process may include brush cleaning, megasonic cleaning, and/or a spin-rinse cycle. During the cleaning process, the O$_3$/DIW solution is provided to the cleaning unit 104 to remove the residue corrosion inhibitor 310 and the metal residue 312 as discussed earlier in the present disclosure.

Figure 6A:
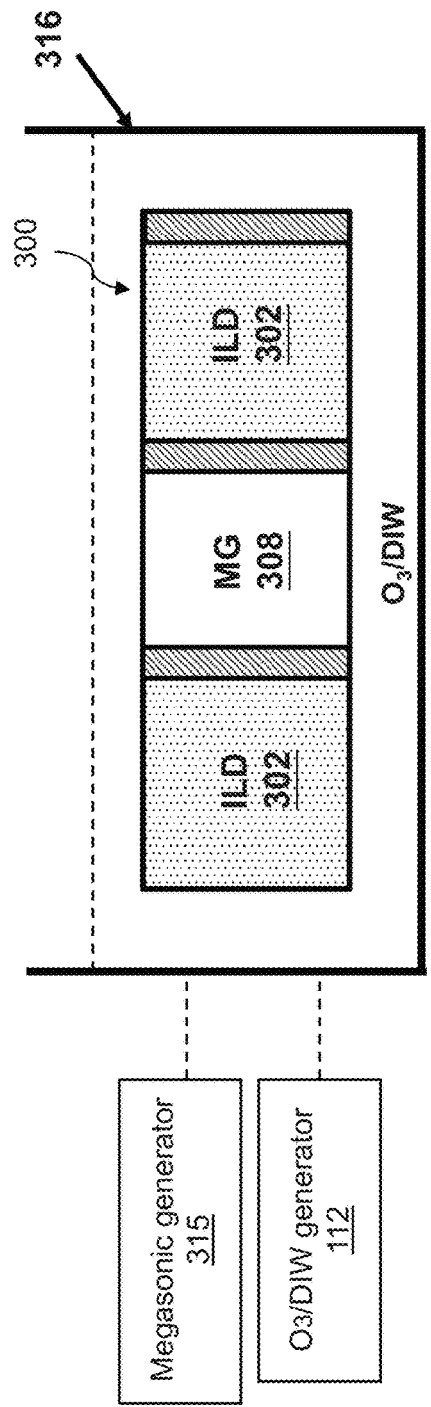
Figure 6B:
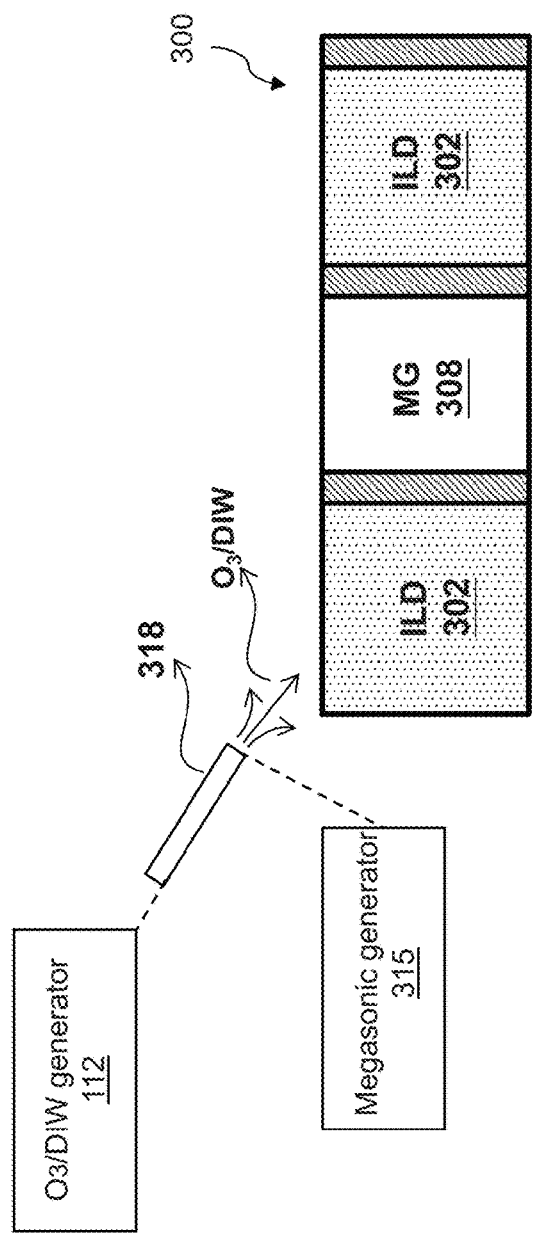

FIGS. 6A-6B are exemplary embodiments of cleaning the buffed surface of the semiconductor structure using the non-contact module 106. In some embodiments as shown in FIG. 6A, the non-contact module 106 of the cleaning unit 104 may include a water tank 316 coupled to a megasonic generator 315 to provide an oscillating or pulsating liquid at frequencies ranging from about 10 Hz to about 500 MHz to clean the polished surface of the semiconductor structure. In some embodiments, the water tank 316 may be coupled to the O$_3$/DIW generator 112 to receive the O$_3$/DIW solution. The semiconductor structure 300 may be immersed in the megasonic-energized O$_3$/DIW bath contained in the water tank 316.

Referring to FIG. 6B, in some alternative embodiments, the non-contact module 106 of the cleaning unit 104 may include a spray nozzle 318 coupled to the megasonic generator 315 to provide an oscillating or pulsating O$_3$/DIW fog to be sprayed onto the surface of the semiconductor structure 300 for cleaning. The O$_3$/DIW fog may be generated at frequencies ranging from about 10 Hz to about 500 MHz. The spray nozzle 318 may be coupled to the O$_3$/DIW generator 112 to receive the O$_3$/DIW solution for cleaning.

Figure 7:
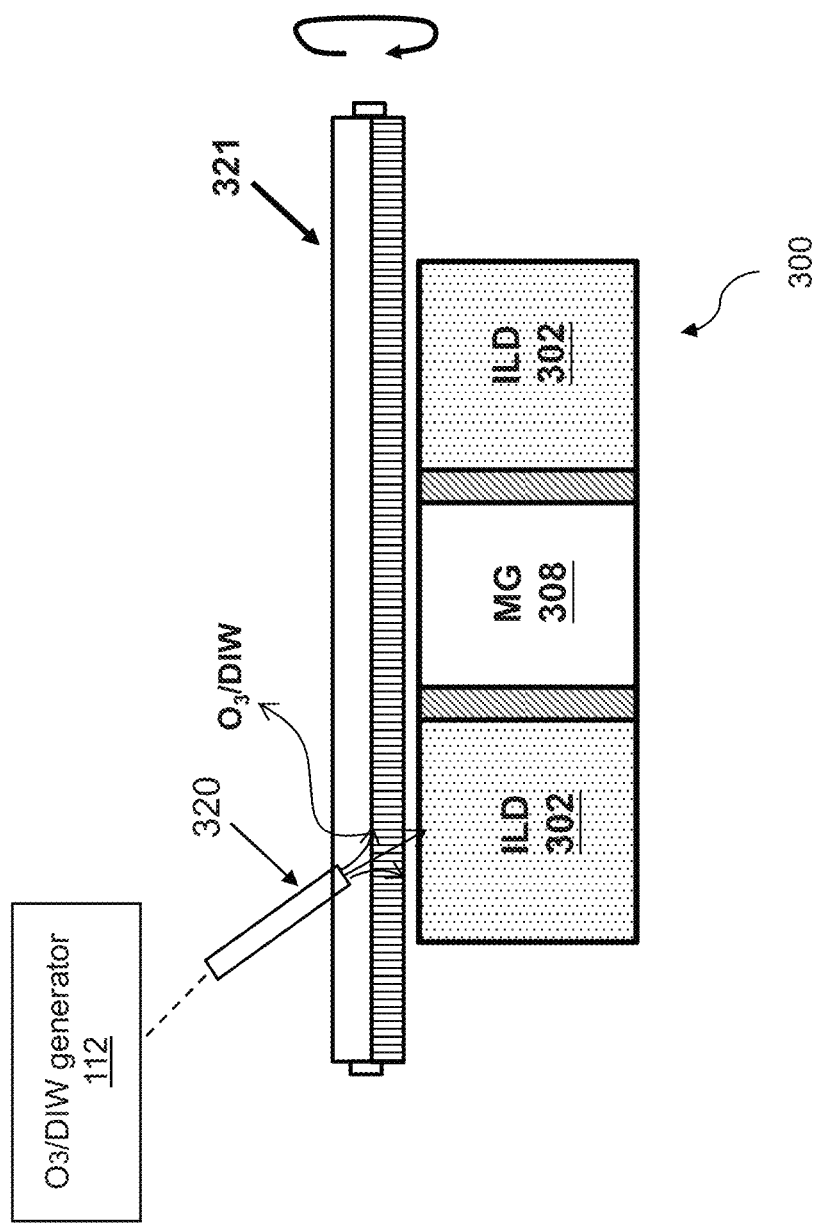

FIG. 7 is an exemplary embodiment of cleaning the polished surface of the semiconductor structure using the contact module 108. In some embodiments, the contact module 108 may include a brush 321 for scrubbing the surface of the semiconductor structure. The cleaning solution may be sprayed out of the spray nozzle 320 while the brush 321 rotates to scrub off residue from the polishing process. Typical scrubbers may include one or more rotating cylindrical brushes (e.g., brush 321 of FIG. 7) that contact and brush the slurry residue, particles, and other contaminants from a semiconductor structure surface. Double-sided scrubbers may simultaneously scrub the top and bottom surfaces of a wafer with two rotating cylindrical brushes. Each wafer may lie flat on a conveyor mechanism which moves the wafer into and between the brushes. When the surface of the wafer is being scrubbed, the conveyor mechanism, rollers, and brushes may support and hold the wafer horizontally or vertically. One or more rollers may engage the edge of the semiconductor wafer to rotate the wafer while one or both surfaces are scrubbed by the brushes. In some embodiments, the spray nozzle 320 may be coupled to the O$_3$/DIW generator 112 to receive the O$_3$/DIW solution to be sprayed onto the surface of the wafer while using the contact module 108 for cleaning. It is to be understood that at step 206, the various embodiments of the non-contact module 106 and contact module 108 may be performed in any suitable configurations and sequences during the cleaning process.

As discussed earlier in the present disclosure, the O$_3$/DIW solution may remove the residue corrosion inhibitor 310 and the metal residue 312 during the polishing and/or cleaning process. The O$_3$ dissolved in the O$_3$/DIW solution may react with the functional group (e.g., functional group —CH$_2$) in the residue corrosion inhibitor 310 as illustrated in equation (1):

$$—CH_2+3O_3 \rightarrow CO_2+3O_2+3H_2O \tag{1}$$

The O$_3$/DIW solution generated by the O$_3$/DIW generator 112 and provided to the polishing unit 102 and the cleaning unit 104 may have a concentration of O$_3$ in the solution in a range from about 5 ppm to about 70 ppm. The temperature of the O$_3$/DIW solution supplied to the polishing unit 102 and/or cleaning unit 104 may be in a range from about 15° C. to about 60° C. The pH value of the O$_3$/DIW solution may be in a range from about 4 to about 9. In some examples, the pH value of the $O_3$/DIW solution may be adjusted to be around 6, so that the metals in the MG layer may be able to form a stable coating of an oxide on the MG layer surface. The $O_3$/DIW solution may be applied to the semiconductor structure 300 by the polishing unit 102 and/or cleaning unit 104 for a time in a range from about 5 to about 240 seconds. In some embodiments, the concentration, the flow rate, the temperature, and/or the pH value of the $O_3$/DIW solution may be controlled by the computer 110 coupled to the polishing unit 102 and the cleaning unit 104 using one or more programmable applications.

Figure 8A:
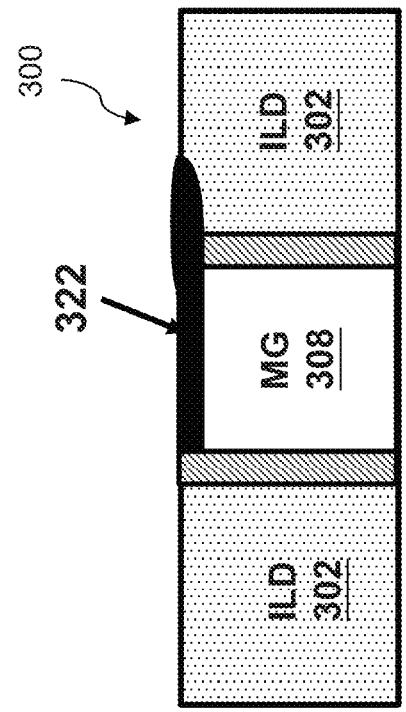
Figure 8B:
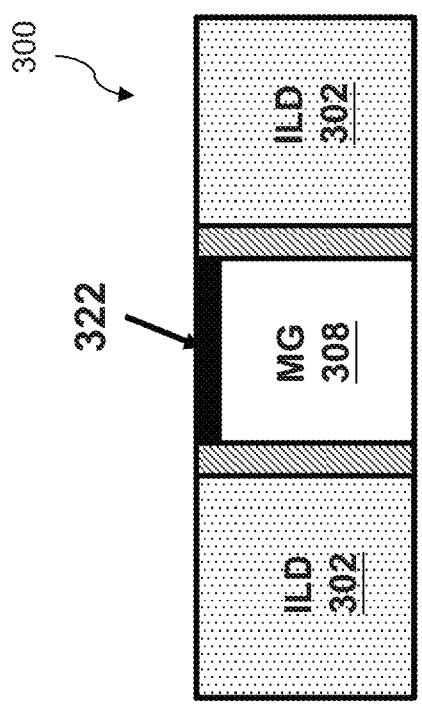

Referring to FIGS. 8A-8B, in some examples, when the surface of the semiconductor structure 300 is performed with a polishing process and/or a cleaning process using $O_3$/DIW solution with a pH value ranging from about 4 to about 9, the aluminum (Al) in the MG layer may form a layer of aluminum oxide ($Al_2O_3$) 322 on the surface of MG layer 308 to prevent the MG layer 308 from corrosions in the following process. In some embodiments, the in-situ CMP process discussed in the present disclosure includes forming the $Al_2O_3$ layer 322 simultaneously during the buffing and/or cleaning process using $O_3$/DIW solution. In some embodiments, the $Al_2O_3$ layer 322 formed during polishing or cleaning using $O_3$/DIW solution may have a thickness ranging from about 50 Å to about 60 Å, which may be thicker than the native $Al_2O_3$ layer formed by exposing the Al metal in the air. In addition, the density of the $Al_2O_3$ layer 322 formed when using $O_3$/DIW solution may be greater than that of the native $Al_2O_3$ layer. The formed $Al_2O_3$ layer 322 may improve the interfacial adhesion between the MG layer 308 and the subsequent deposit layers, such as the ESL layer. In addition as shown in FIG. 8B, the metal residue 312 on ILD 302 as shown in FIG. 4B may also be oxidized to form $Al_2O_3$ layer 322 to block the chemical attack path, and to prevent the MG layer 308 from being damaged by the acid etching chemicals in the following process.

Figure 8C:
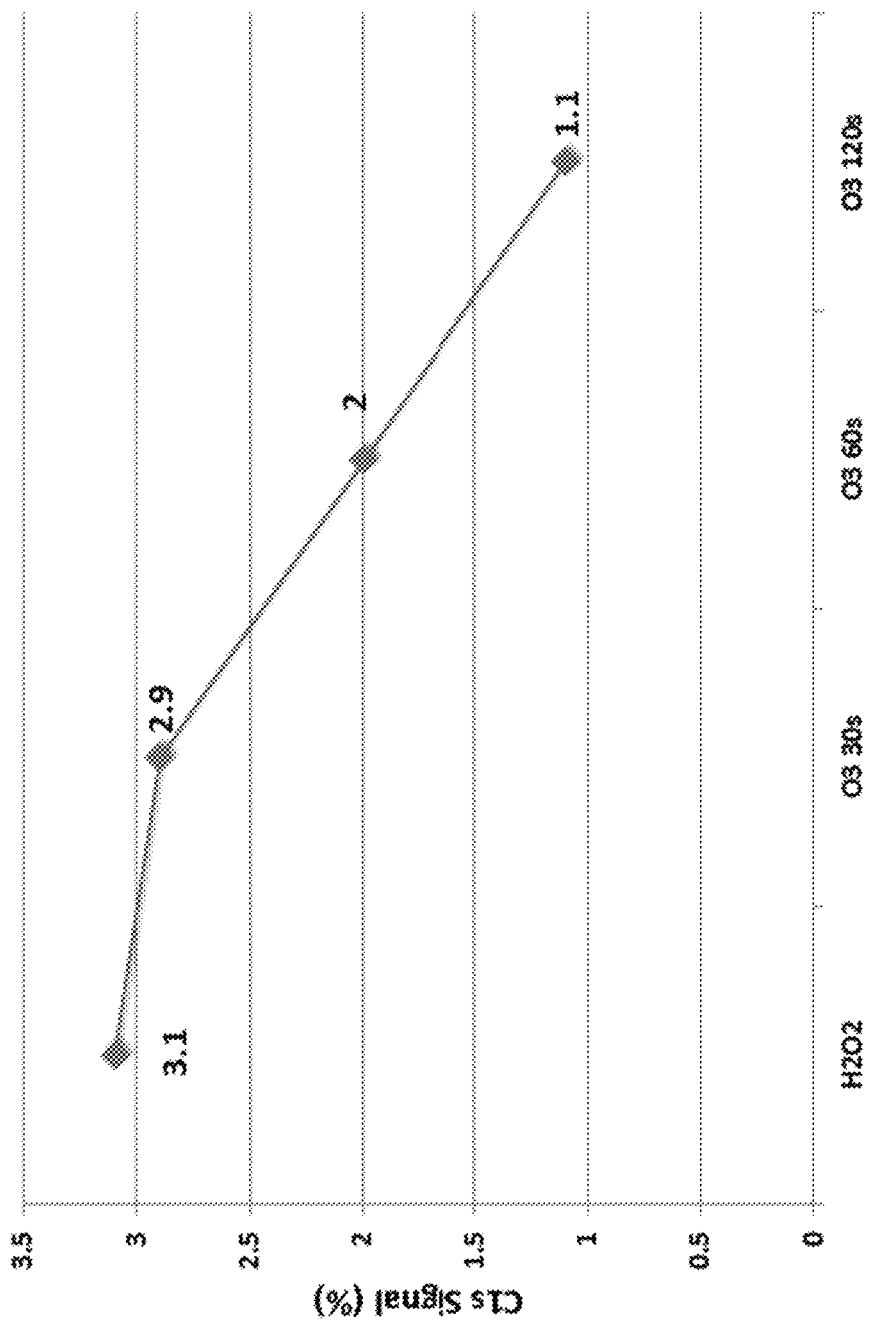
FIGS. 8C and 8D are X-ray Photoelectron Spectroscopy (XPS) results of the surface of the semiconductor structure cleaned using $H_2O_2$ or $O_3$ ($O_3$ dissolved in DIW) as the cleaning solution in the cleaning process and/or buffing process.
Figure 8D:
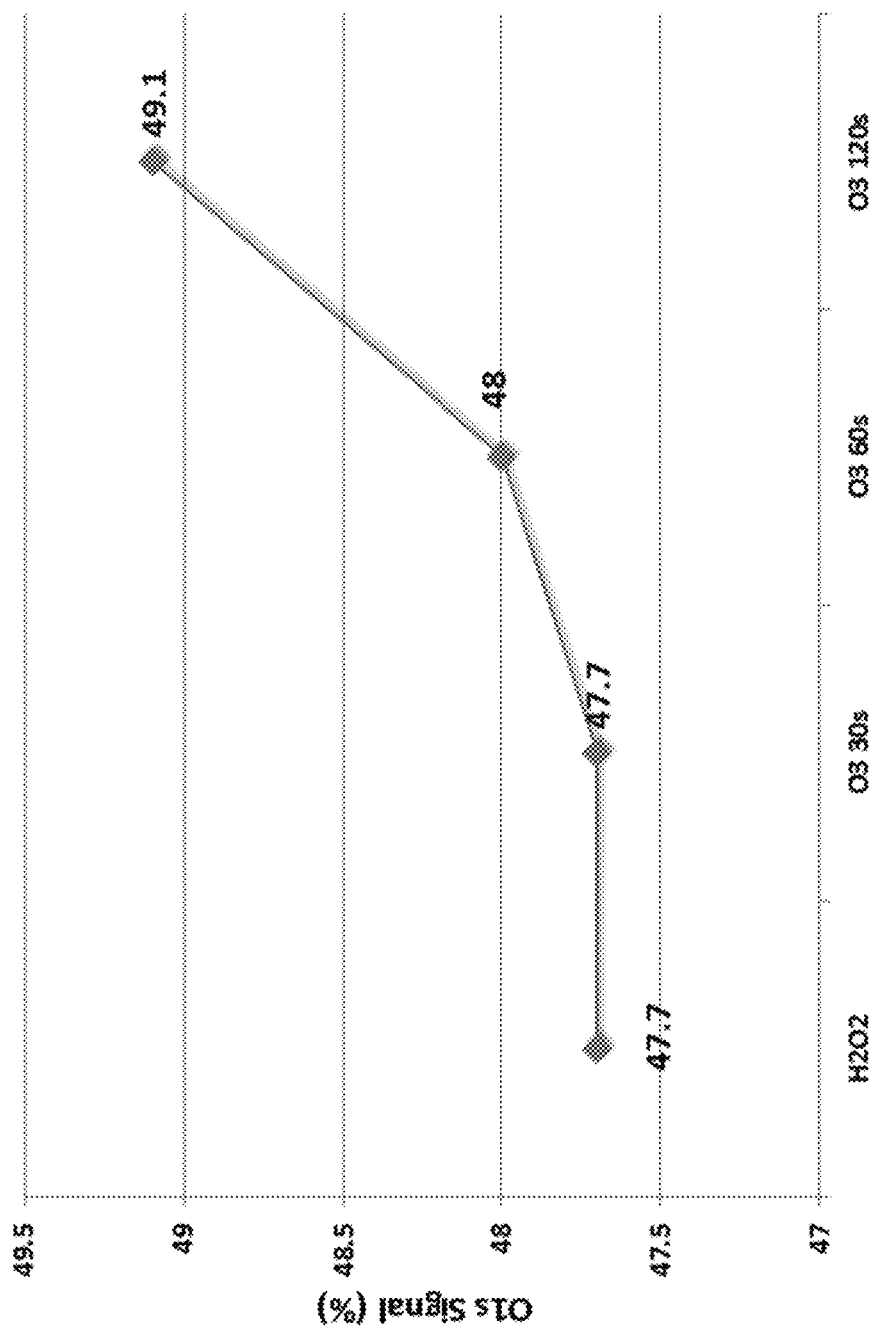

Referring to FIGS. 8C-8D, the X-ray Photoelectron Spectroscopy (XPS) results of the surface of the semiconductor structure 300 cleaned using $H_2O_2$ or $O_3$ ($O_3$ dissolved in DIW) as the cleaning solution in the buffing and/or cleaning process are compared. In FIG. 8C, the intensities of the carbon (C1s) signal may reflect the amount of organic residue including the corrosion inhibitor 310 on the surface of the semiconductor structure 300. FIG. 8C shows greater carbon (C1s) intensity in the XPS result of the surface of the semiconductor structure 300 cleaned with $H_2O_2$ compared to that cleaned with $O_3$/DIW solution, which reflects an improved removal effect of the organic residue when using $O_3$/DIW solution. In addition, when the surface of the semiconductor structure 300 is cleaned using $O_3$/DIW solution for a longer time, e.g., 120 seconds, the carbon (C1s) intensity or the amount of the organic residue is reduced compared to that cleaned for a less period of time, e.g., 30 seconds. The XPS results shown in FIG. 8C demonstrate that $O_3$/DIW solution is an effective cleaning solution to remove the organic residue during the buffing process and the cleaning process after the CMP process.

Referring to FIG. 8D, the intensities of the oxygen (O1s) signal may reflect the amount of $Al_2O_3$, which is related to the thickness of $Al_2O_3$ layer formed on the surface of the MG layer 308. As shown in FIG. 8D, the intensity of the oxygen (O1s) signal of the semiconductor structure 300 cleaned using the $O_3$/DIW solution is greater than that cleaned using $H_2O_2$. In addition, the intensity of the oxygen (O1s) signal increases as the semiconductor structure 300 is cleaned using $O_3$/DIW solution for longer time. The XPS results shown in FIG. 8D demonstrate that $O_3$/DIW solution is an effective cleaning solution to grow a thicker metal oxide layer on the MG layer during the buffing process and the cleaning process after the CMP process.

Referring to FIG. 2, after the cleaning process at step 208, the method 200 proceeds to step 210 by drying and transferring the semiconductor structure out of the CMP system for subsequent processes. In some embodiments after the cleaning process, the wafer may be dried using any suitable drying methods. For example, the wafer may be performed with vacuum baking in an inert gas environment. The dried wafer may then be transferred out of the CMP system for further processing.

Figure 9A:
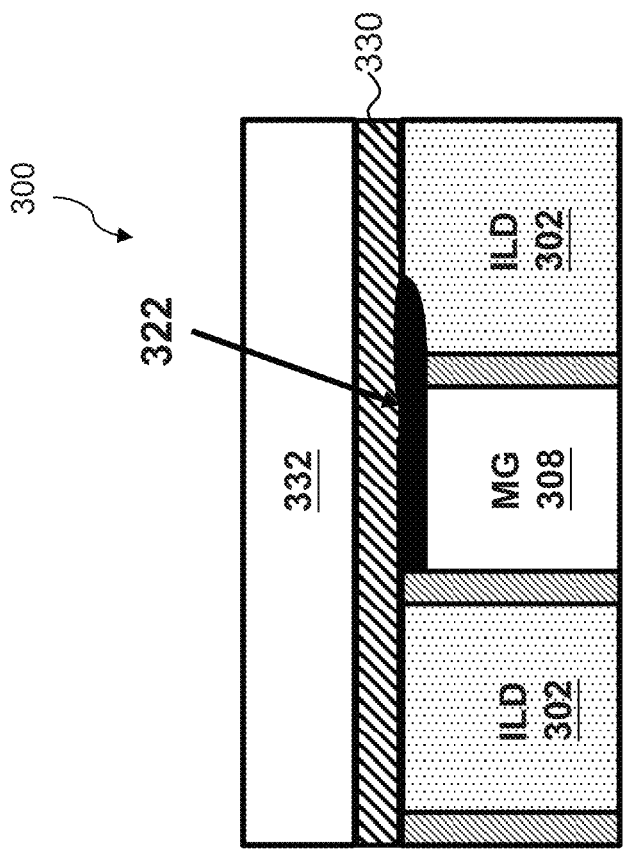
Figure 9B:
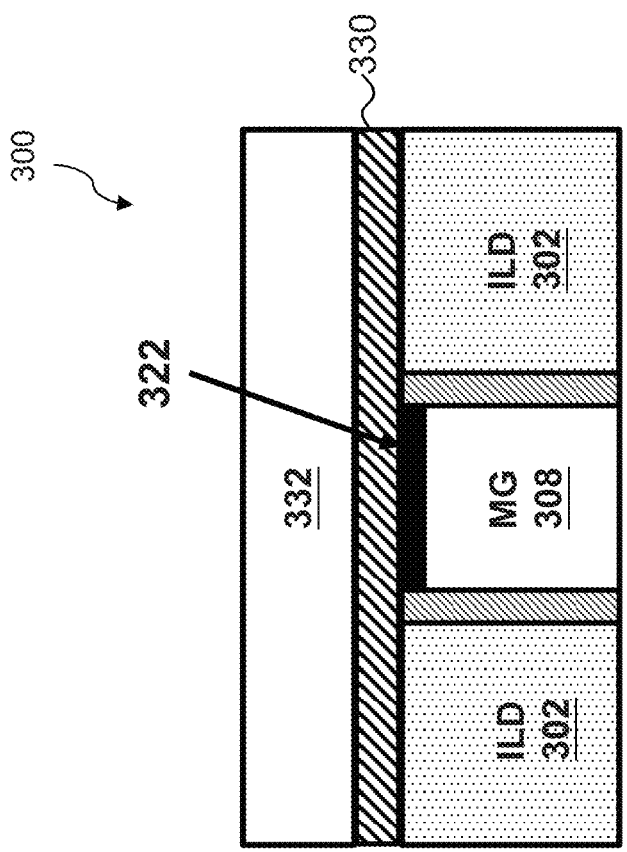

Referring to FIGS. 2 and 9A-9B, method 200 proceeds to step 212 by depositing an etch stop layer (ESL) 330 on the planarized surface of the semiconductor structure 300. In some embodiments, the ESL 330 may include silicon nitride ($Si_4N_3$). As discussed earlier in the present disclosure, the interfacial adhesion between the MG layer 308 and the ESL 330 may be improved by having $Al_2O_3$ layer 322 formed using the $O_3$/DIW solution in the buffing process and/or cleaning process. Another ILD layer 332 may be further deposited on the ESL 330. The ESL 330 and the ILD layer 332 may be deposited using any suitable technique, such as CVD, PVD, atomic layer deposition (ALD), or an epitaxial growing process.

Figure 10A:
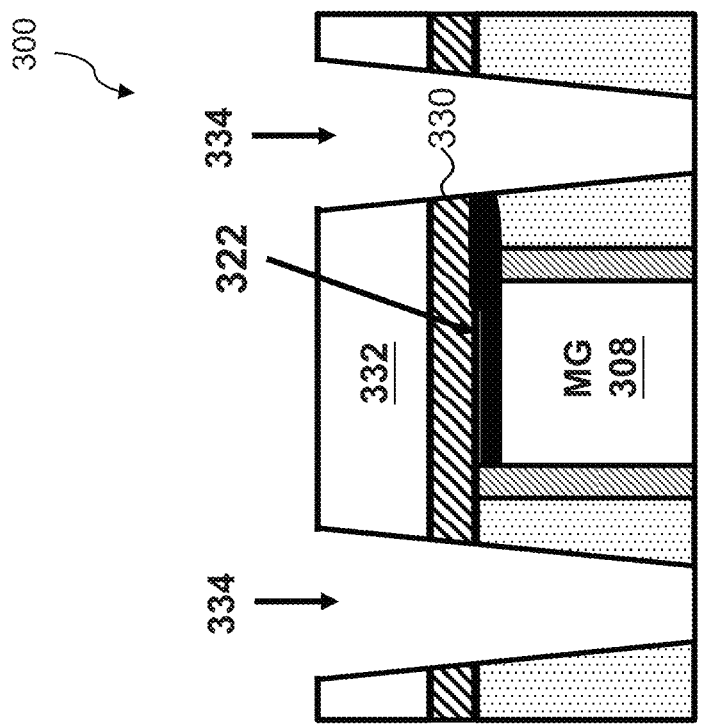
Figure 10B:
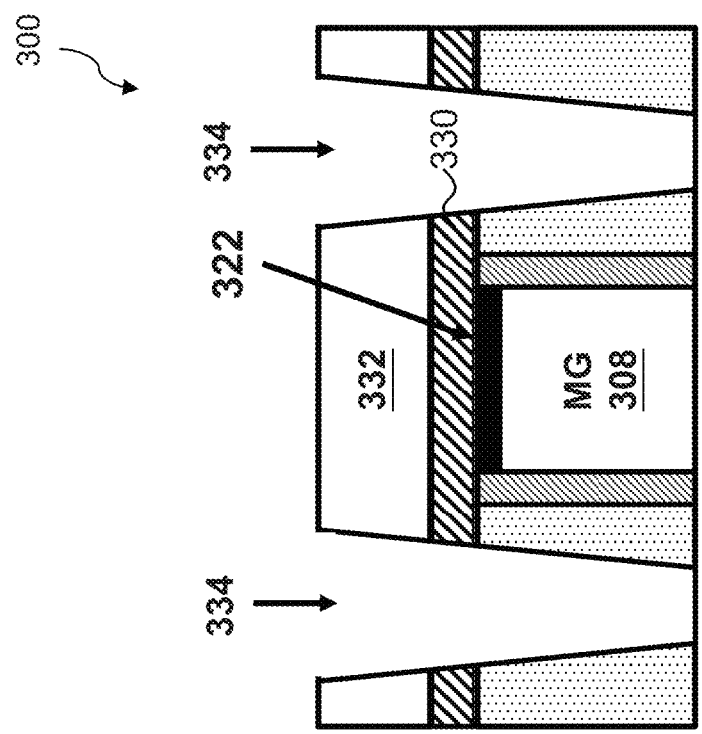

Referring to FIGS. 2 and 10A-10B, method 200 proceeds to step 214 by performing a subsequent etching process to form multilayer interconnect features, such as contact/via holes 334. The contact/via holes 334 may be formed through the ESL 330 and the ILD 302. In some embodiments, the etching process may include any appropriate drying etching and/or wet etching method. It is understood that the wafer including the semiconductor structure 300 may undergo further processing to form various features, such as barrier layers, metal contacts, metal plug etc. In some embodiments, the MG layer 308 may be formed on a semiconductor substrate, or on a dielectric layer on the semiconductor substrate. As shown in FIGS. 10A-10B, the $Al_2O_3$ layer 322 formed using $O_3$/DIW solution may provide improved interfacial adhesion between the ESL 330 and the MG layer 308. Moreover, the formed $Al_2O_3$ layer 322 may effectively prevent the MG layer 308 from being damaged by the acid etching chemicals in the following processes.

Although not intended to be limiting, the present disclosure provides one or more benefits for the CMP and clean processes. For example as shown in equation (1), because the by-products of using $O_3$/DIW solution to buff and clean the wafer including the semiconductor structure 300 include $O_2$ and $H_2O$, it is an environment friendly process. In the present disclosure, no strong oxidizers are used to remove the organic residue or to oxidize the metal layer. Thus the device electrical performance may not be degraded by the excessive trace metal ions, such as alkali ions in $NaClO_4$, $NaClO_3$, $NaClO_2$, $NaClO$, $KMnO_4$, $K_2Cr_2O_7$, or $Fe^{2+}$ in a Fenton agent. In addition, the oxidizing efficiency of the metal on the surface of the MG layer and/or ILD layer may be tuned by controlling the $O_3$ concentration in the $O_3$/DIW solution, so that an optimized treatment time may be obtained to have both improved cleaning result and high throughput. Furthermore, the pH value of the $O_3$/DIW solution may be controlled to be suitable for the metals in the MG layer to form a stable oxide coating on the MG layer surface. The corrosion in the following processes may be reduced.

The present disclosure provides a method of fabricating a semiconductor device. The method includes providing a semiconductor structure including a metal gate (MG) layer formed to fill in a trench between two adjacent interlayer dielectric (ILD) regions; performing a chemical mechanical polishing (CMP) process using a CMP system to planarize the MG layer and the ILD regions; and cleaning the planarized MG layer using a $O_3$/DIW solution including ozone gas ($O_3$) dissolved in deionized water (DIW). The MG layer is formed on the ILD regions.

In some embodiments, the method further comprises forming a metal oxide layer on the MG layer simultaneously with cleaning the planarized MG layer.

In some embodiments, the cleaning the planarized MG layer using the $O_3$/DIW solution comprises removing organic residue from CMP slurry by a reaction: —$CH_2$+ $3O_3 \rightarrow CO_2+3O_2+3H_2O$, the organic residue including a functional group —$CH_2$.

In some embodiments, the $O_3$/DIW solution is generated by an $O_3$/DIW generator coupled to a polishing unit of the CMP system. In some embodiments, the cleaning the planarized MG layer includes buffing a surface of the semiconductor structure using a buffing pad and the $O_3$/DIW solution in the polishing unit. The polishing unit includes a pipeline coupled to the $O_3$/DIW generator to supply the $O_3$/DIW solution to the buffing pad.

In some embodiments, an $O_3$/DIW generator is coupled to a cleaning unit of the CMP system to supply the $O_3$/DIW solution.

In some embodiments, the cleaning unit includes a water tank coupled to the $O_3$/DIW generator. In some embodiments, the cleaning the planarized MG layer includes cleaning a surface of the semiconductor structure in the water tank further coupled to a megasonic generator configured to provide an oscillation to the $O_3$/DIW solution contained in the water tank.

In some embodiments, the cleaning unit includes a spray nozzle coupled to the $O_3$/DIW generator. In some embodiments, the cleaning the planarized MG layer includes cleaning a surface of the semiconductor structure using the spray nozzle further coupled to a megasonic generator configured to provide an oscillation to the $O_3$/DIW solution to form an $O_3$/DIW fog to be sprayed from the spray nozzle to the surface of the semiconductor structure.

In some embodiments, the cleaning unit includes a brush configured to scrub a surface of the semiconductor structure, and a spray nozzle coupled to the $O_3$/DIW generator. In some embodiments, the cleaning the planarized MG layer includes scrubbing the surface of the semiconductor structure using the brush and the $O_3$/DIW solution sprayed from the spray nozzle.

In some embodiments, the cleaning the planarized MG layer includes buffing a surface of the semiconductor structure using a buffing pad and the $O_3$/DIW solution in a polishing unit; and cleaning the surface of the semiconductor structure in a water tank coupled to a megasonic generator configured to provide an oscillation to the $O_3$/DIW solution contained in the water tank. The polishing unit includes a pipeline coupled to an $O_3$/DIW generator configured to supply the $O_3$/DIW solution to the buffing pad. The water tank is coupled to the $O_3$/DIW generator configured to supply the $O_3$/DIW solution to the water tank.

In some embodiments, the cleaning the planarized MG layer includes buffing a surface of the semiconductor structure using a buffing pad and the $O_3$/DIW solution in a polishing unit, and cleaning the surface of the semiconductor structure using a spray nozzle coupled to a megasonic generator configured to provide an oscillation to the $O_3$/DIW solution to form an $O_3$/DIW fog to be sprayed from the spray nozzle to the surface of the semiconductor structure. The polishing unit includes a pipeline coupled to an $O_3$/DIW generator configured to supply the $O_3$/DIW solution to the buffing pad. The spray nozzle is coupled to the $O_3$/DIW generator.

In some embodiments, the cleaning the planarized MG layer includes buffing a surface of the semiconductor structure using a buffing pad and the $O_3$/DIW solution in a polishing unit, and scrubbing the surface of the semiconductor structure using a brush and the $O_3$/DIW solution sprayed from a spray nozzle. The spray nozzle is coupled to the $O_3$/DIW generator. The polishing unit includes a pipeline coupled to an $O_3$/DIW generator configured to supply the $O_3$/DIW solution to the buffing pad.

In some embodiments, a pH value of the $O_3$/DIW solution is in a range from about 4 to about 9. A concentration of the $O_3$ dissolved in the $O_3$/DIW solution is in a range from about 5 ppm to about 70 ppm.

In some embodiments, the method of fabricating a semiconductor device further comprises drying the cleaned semiconductor structure; depositing an etch stop layer (ESL) over the ILD regions and the MG layer; and forming a contact hole through the ESL and the ILD regions.

The present disclosure also provides a chemical mechanical polishing (CMP) system. The CMP system includes a $O_3$/DIW generator configured to generate a $O_3$/DIW solution including ozone gas ($O_3$) dissolved in deionized water (DIW); a polishing unit including components for planarizing and buffing a surface of a semiconductor structure; and a cleaning unit coupled to the $O_3$/DIW generator and configured to clean the planarized the surface of the semiconductor structure using the $O_3$/DIW solution. The polishing unit including a pipeline coupled to the $O_3$/DIW generator to provide the $O_3$/DIW solution for buffing.

In some embodiments, the cleaning unit includes a spray nozzle coupled to the $O_3$/DIW generator and configured to supply the $O_3$/DIW solution to the semiconductor structure. The cleaning unit includes a brush configured to scrub the surface of the semiconductor structure when the spray nozzle sprays the $O_3$/DIW solution to the semiconductor structure. The spray nozzle is coupled to a megasonic generator configured to provide an oscillation to the $O_3$/DIW solution supplied by the $O_3$/DIW generator to form an $O_3$/DIW fog to be sprayed from the spray nozzle to the semiconductor structure r.

In some embodiments, the cleaning unit includes a water tank coupled to a megasonic generator and the $O_3$/DIW generator. The megasonic generator is configured to provide an oscillation to the $O_3$/DIW solution contained in the water tank.

The present disclosure also discloses a semiconductor device comprises a plurality of interlayer dielectric (ILD) regions; a metal gate (MG) layer configured to fill a trench between two adjacent ILD regions; an oxide layer formed on the MG layer; and an etch stop layer (ESL) deposited on the oxide layer. The MG layer and the ILD regions have a coplanar top surface. The coplanar top surface is cleaned using a $O_3$/DIW solution including ozone gas ($O_3$) dissolved in deionized water (DIW). The oxide layer is formed by oxidizing a metal in the MG layer using the $O_3$/DIW solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
performing a planarization process in a polishing unit of a chemical mechanical polishing (CMP) system to planarize a surface of a material layer using a CMP slurry;
after performing the planarization process, performing a buffing process in the polishing unit of the CMP system to buff the surface of the material layer using an ozone gas ($O_3$) dissolved in deionized water (DIW) ($O_3$/DIW) solution; and
controlling the performing of the planarization process and the performing of the buffing process by a control unit of the CMP system, such that the CMP slurry is received by the polishing unit from a first pipeline during the planarization process and the $O_3$/DIW solution is received by the polishing unit from a second pipeline during the buffing process.

2. The method of claim 1, further comprising:
after performing the buffing process, performing a cleaning process in a cleaning unit of the CMP system on the surface of the material layer using the $O_3$/DIW solution; and
controlling the performing of the cleaning process, such that the $O_3$/DIW solution is received by the cleaning unit.

3. The method of claim 2, wherein the performing the cleaning process includes:
immersing the material layer in the $O_3$/DIW solution in a water tank; and
oscillating the $O_3$/DIW solution.

4. The method of claim 3, wherein the controlling the performing of the cleaning process includes configuring the oscillating of the $O_3$/DIW solution to a frequency of about 10 Hz to about 500 MHz.

5. The method of claim 2, wherein the performing the cleaning process includes:
oscillating the $O_3$/DIW solution to form an $O_3$/DIW fog; and
spraying the $O_3$/DIW fog on the surface of the material layer.

6. The method of claim 5, wherein the controlling the performing of the cleaning process includes configuring the oscillating of the $O_3$/DIW solution to a frequency of about 10 Hz to about 500 MHz.

7. The method of claim 1, wherein the controlling the performing of the buffing process includes configuring an $O_3$ concentration, a flow rate, a temperature, a pH value, or combinations thereof of the $O_3$/DIW solution.

8. The method of claim 1, wherein the surface of the material layer includes a metal layer and the controlling the performing of the buffing process includes controlling a pH value of the $O_3$/DIW solution during the buffing process, such that a metal oxide layer is formed on the metal layer.

9. The method of claim 1, further comprising generating the $O_3$/DIW solution by:
flowing $O_3$ gas within a fiber membrane; and
immersing the fiber membrane in DIW, wherein the $O_3$ gas) diffuses from inside the fiber membrane to outside the fiber membrane, such that the $O_3$ gas) is dissolved in the DIW.

10. A method comprising:
planarizing a material layer in a chemical mechanical polishing (CMP) unit;
buffing the material layer in the CMP unit after the planarizing;
cleaning the material layer in a cleaning unit after the buffing wherein the CMP unit and the cleaning unit are a portion of a CMP system; and
controlling a supply means during the planarizing, the buffing, and the cleaning, such that the supply means supplies a CMP slurry during the planarizing, an ozone gas ($O_3$) dissolved in deionized water (DIW) ($O_3$/DIW) solution during the buffing, and an oscillating $O_3$/DIW solution during the cleaning.

11. The method of claim 10, wherein the controlling the supply means includes:
causing the supply means to deliver the CMP slurry to a polishing pad of the CMP unit during the planarizing the material layer; and
causing the supply means to deliver the $O_3$/DIW solution to a buffing pad during the buffing the material layer.

12. The method of claim 10, wherein the material layer includes a metal portion, wherein the controlling the supply means includes configuring the $O_3$/DIW solution supplied during the buffing to cause formation of metal oxide on the metal portion.

13. The method of claim 12, wherein the configuring the $O_3$/DIW solution supplied during the buffing to cause formation of metal oxide on the metal portion includes:
controlling a temperature of the $O_3$/DIW solution to about 15° C. to about 60° C.;
controlling a pH value of the $O_3$/DIW solution to about 4 to about 9; and
controlling a concentration of $O_3$ in the $O_3$/DIW solution to about 5 ppm to about 70 ppm.

14. The method of claim 10, further comprising drying the material layer in the cleaning unit after the cleaning.

15. The method of claim 10, the method further comprising:
transferring the material layer out of the CMP system; and
forming a dielectric layer over the material layer.

16. The method of claim 15, wherein:
the material layer includes a metal gate;
the controlling the supply means includes configuring the $O_3$/DIW solution supplied during the buffing to cause formation of metal oxide on the metal gate; and
the dielectric layer includes silicon and nitrogen.

17. A method comprising:
processing a semiconductor structure using a chemical mechanical polishing (CMP) system, wherein the CMP system includes:
an $O_3$/DIW generator configured to generate an $O_3$/DIW solution including ozone gas ($O_3$) dissolved in deionized water (DIW);
a polishing unit including components for planarizing a surface of the semiconductor structure and buffing the surface of the semiconductor structure, wherein the polishing unit includes:
a first pipeline configured to supply CMP slurry during the planarizing the surface of the semiconductor structure, and
a second pipeline coupled to the $O_3$/DIW generator, wherein the second pipeline is configured to supply the $O_3$/DIW solution during the buffing the surface of the semiconductor structure;

a cleaning unit coupled to the O$_3$/DIW generator and configured to clean the surface of the semiconductor structure using the O$_3$/DIW solution; and a computer coupled to the polishing unit and the cleaning unit, wherein the computer is configured to control the polishing unit to:

perform a planarization process to planarize the surface of the semiconductor structure using CMP slurry received from the first pipeline, and after performing the planarization process, perform a buffing process to buff the surface of the semiconductor structure using O$_3$/DIW solution received from the second pipeline.

18. The method of claim 17, wherein the cleaning unit includes a spray nozzle that is coupled to the O$_3$/DIW generator, wherein the computer controls the O$_3$/DIW generator to oscillate the O$_3$/DIW solution to supply an O$_3$/DIW fog to the spray nozzle during a cleaning process performed by the cleaning unit to clean the surface of the semiconductor structure.

19. The method of claim 17, wherein the cleaning unit includes a water tank that is coupled to the O$_3$/DIW generator, wherein the computer controls the O$_3$/DIW generator to oscillate the O$_3$/DIW solution and supply the oscillating O$_3$/DIW solution in the water tank while the semiconductor structure is immersed in the water tank.

20. The method of claim 19, wherein the computer controls a pH value of the O$_3$/DIW solution, such that the pH value is about 4 to about 9.

* * * * *